United States Patent
Kitamura et al.

(10) Patent No.: US 9,035,376 B2
(45) Date of Patent: May 19, 2015

(54) SEMICONDUCTOR DEVICE AND METHOD OF MANUFACTURING THE SAME

(71) Applicant: FUJI ELECTRIC CO., LTD., Kawasaki-shi (JP)

(72) Inventors: Mutsumi Kitamura, Matsumoto (JP); Michiya Yamada, Hino (JP); Tatsuhiko Fujihira, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 14/174,122

(22) Filed: Feb. 6, 2014

(65) Prior Publication Data
US 2014/0225217 A1 Aug. 14, 2014

(30) Foreign Application Priority Data
Feb. 14, 2013 (JP) .................................. 2013-026592

(51) Int. Cl.
H01L 29/94 (2006.01)
H01L 21/338 (2006.01)
H01L 21/336 (2006.01)
H01L 29/06 (2006.01)

(52) U.S. Cl.
CPC .................................. H01L 29/0688 (2013.01)

(58) Field of Classification Search
CPC ............ H01L 29/1095; H01L 29/7813; H01L 29/7802; H01L 29/0878; H01L 29/66712; H01L 29/4236; H01L 29/7395; H01L 29/7827; H01L 29/66666; H01L 29/66333
USPC .......... 438/173, 268, 270, 478; 257/328–330, 257/341
See application file for complete search history.

(56) References Cited

U.S. PATENT DOCUMENTS

| | | | |
|---|---|---|---|
| 5,216,275 A | 6/1993 | Chen | |
| 7,687,851 B2 * | 3/2010 | Hshieh | .......................... 257/330 |
| 2003/0148559 A1 | 8/2003 | Onishi et al. | |
| 2013/0026560 A1 | 1/2013 | Onishi et al. | |

FOREIGN PATENT DOCUMENTS

| | | |
|---|---|---|
| JP | 2001-119022 A | 4/2001 |
| JP | 2007-235080 A | 9/2007 |
| JP | 2010-225831 A | 10/2010 |
| WO | 2011/093473 A1 | 8/2011 |

* cited by examiner

Primary Examiner — Hsien Ming Lee
(74) Attorney, Agent, or Firm — Rossi, Kimms & McDowell LLP

(57) ABSTRACT

A semiconductor device and method of manufacturing the semiconductor device is disclosed in which the tradeoff relationship between the Eoff and the turning OFF dV/dt is improved at a low cost using a trench embedding method. The method comprises a step of forming a parallel pn layer that is a superjunction structure using a trench embedding method and a step of ion implantation into an upper part of an n type semiconductor layer, i.e., an n type column, forming a high concentration n type semiconductor region. This method improves the trade-off relationship between the Eoff and the turning OFF dV/dt as compared with a high concentration n type semiconductor region formed of an epitaxial layer. This method achieves shorter process time and lower cost in manufacturing because it eliminates the redundant repeating of steps performed in the conventional method of forming a superjunction structure through multi-stage epitaxial growth.

19 Claims, 15 Drawing Sheets

SEMICONDUCTOR DEVICE AND METHOD OF MANUFACTURING THE SAME

CROSS-REFERENCE TO RELATED APPLICATION

This application is based on, and claims priority to, Japanese Patent Application No. 2013-026592, filed on Feb. 14, 2013, contents of which are incorporated herein by reference.

BACKGROUND OF THE INVENTION

A. Field of the Invention

The present invention relates to a power semiconductor device such as a MOSFET, and in particular, to a semiconductor device and a method of manufacturing the semiconductor device that has a drift layer with a superjunction structure, or a parallel pn column structure or parallel pn layer structure. The superjunction structure comprises an n type column and a p type column alternately adjoining each other and extending in a vertical direction with respect to a principal surface of a semiconductor substrate.

B. Description of the Related Art

Semiconductor devices are generally classified into lateral devices having electrodes formed on one surface of a semiconductor substrate and vertical devices having electrodes formed on both surfaces of a semiconductor substrate. In a vertical semiconductor device, drift current in an ON state flows in a direction that is same as the direction for a depletion layer to extend in an OFF state caused by a reverse bias voltage. In a usual planar type n channel vertical MOSFET, the drift current flows vertically through a high resistivity $n^-$ drift layer in an ON state. Thus, if the current path in the $n^-$ drift layer is shortened, the drift resistance decreases and a substantial ON resistance of the MOSFET also decreases.

The $n^-$ drift layer with a high resistance becomes depleted in an OFF state and enhances a withstand voltage. Consequently, a thin $n^-$ drift layer narrows an expansion width of the depletion layer between the drain and base extending from the pn junction between the p base region and the $n^-$ drift layer, resulting in a lowered withstand voltage. Conversely, a semiconductor device exhibiting a high withstand voltage with a thick $n^-$ drift layer has a large ON resistance and increases a conduction loss. Thus, the ON resistance and the withstand voltage are in a trade-off relationship. This trade-off relationship is known to hold similarly with semiconductor devices such as IGBTs, bipolar transistors and diodes.

In order to cope with the problem of this trade-off relationship, a semiconductor device is known having a drift layer thereof with a superjunction structure composed of a parallel pn layer that is formed by joining alternately a p type semiconductor layer and an n type semiconductor layer containing high concentration of impurities.

FIG. 16 is a sectional view of an essential part of a conventional superjunction semiconductor device 500. The semiconductor device of FIG. 16 is a SJ-MOSFET having a superjunction (SJ) structure. The SJ-MOSFET has parallel pn layer 120 disposed on n type semiconductor substrate 101 ($n^+$ drain region), parallel pn layer 120 being composed of n type semiconductor layer 210 and p type semiconductor layer 209. On parallel pn layer 120, device surface structure 104 is provided. Device surface structure 104 comprises p base region 103, and $p^+$ contact region 105 and $n^+$ source region 106 disposed in the surface region of p base region 103. Device surface structure 104 further comprises gate insulation film 107 disposed on a part of p base region 103 between $n^+$ source region 106 and n type semiconductor layer 210 of parallel pn layer 120, gate electrode 108 disposed on gate insulation film 107, interlayer dielectric film 109 covering gate electrode 108, and source electrode 110 electrically connected with $p^+$ contact region 105 and $n^+$ source region 106. On the back surface of n type semiconductor substrate 101 provided is drain electrode 112. Parallel pn layer 120 is composed of p type semiconductor layer 209 and n type semiconductor layer 210 arranged alternately in contact with each other.

In superjunction semiconductor device 500 having parallel pn layer 120 containing a high concentration of impurities, a depletion layer in an OFF state extends laterally from each pn junction which lies in a vertical direction of parallel pn layer 120 to make the whole drift layer depleted, resulting in a high withstand voltage. The drift layer of n type semiconductor layer 210 is allowed to be high concentration, achieving low ON resistance.

FIGS. 17 through 19 are sectional views of an essential part of the superjunction semiconductor device of FIG. 16 showing a manufacturing method of the device following the sequence of steps of the manufacturing procedure.

(1) First, as shown in FIG. 17, high resistivity n type semiconductor layer 201 is epitaxially grown on n type semiconductor substrate 101. Then patterning and ion implantation are conducted on n type semiconductor layer 201 of an epitaxial layer to form p type ion implantation layer 207 and n type ion implantation layer 208.

(2) Then, as shown in FIG. 18, by repeating the step (1), several layers of semiconductor layers 201 through 205 each including p type ion implantation layer 207 and n type ion implantation layer 208 are laminated. A semiconductor layer 206 is formed on the semiconductor layer 205.

(3) Then, as shown in FIG. 19, driving heat treatment is conducted for diffusion of the impurities in p type ion implantation layer 207 and in n type ion implantation layer 208. As a result, the p type ion implantation layers in the semiconductor layers are joined vertically to form p type semiconductor layer 209 and the n type implantation layers in the semiconductor layers are joined vertically to form n type semiconductor layer 210. P type semiconductor layer 209 and n type semiconductor layer 210 compose parallel pn layer 120 with a superjunction structure. This procedure is a method for forming parallel pn layer 120 called a multi-stage epitaxial growth method.

On parallel pn layer 120 with a superjunction structure, the following are formed: p base region 103, $p^+$ contact region 105, $n^+$ source region 106, gate insulation film 107, gate electrode 108, interlayer dielectric film 109, and source electrode 110. On the back surface of the n type semiconductor substrate, under parallel pn layer 120, drain electrode 112 is formed. Thus, superjunction semiconductor device 500 is completed. The above-mentioned regions of a device surface structure occasionally are formed on an n type layer that is additionally formed on parallel pn layer 120.

Parallel pn layer 120 having a superjunction structure can be formed by a trench embedding method as well as by the multi-stage epitaxial growth method described above. In the trench embedding method, though not depicted, an epitaxial layer is formed on a semiconductor substrate, and a trench is formed in the epitaxial layer. In this trench, a semiconductor layer of a conductivity type opposite to that of the epitaxial layer is embedded.

Descriptions of the following documents are provided:
Patent Document 1
Japanese Unexamined Patent Application Publication No. 2001-119022
Patent Document 2
U.S. Pat. No. 5,216,275

Patent Document 3
International Patent Application Publication WO2011/093473
Patent Document 4
Japanese Unexamined Patent Application Publication No. 2010-225831
Patent Document 5
Japanese Unexamined Patent Application Publication No. 2007-235080.

Patent Document 1 discloses a multi-stage epitaxial growth method in which epitaxial growth and ion implantation are repeated to form a parallel pn layer having a superjunction structure, similar to the one described above.

Patent Document 2 discloses a trench embedding method for forming a parallel pn layer with a superjunction structure, in which an n type semiconductor layer is epitaxially grown on an $n^+$ type semiconductor substrate and a trench is dug in the n type layer. A p type semiconductor layer is epitaxially grown in the trench.

Patent Document 3 discloses achieving improvement of the trade-off relationship between Eoff and turning OFF dV/dt in superjunction semiconductor devices, which are SJ-MOSFETs in the examples of the document, fabricated by a multi-stage epitaxial growth method and a trench embedding method. The Eoff is a turning OFF loss generated in a turning OFF process of the MOSFET. The turning OFF dV/dt is a rising up rate of a re-applied voltage to which the MOSFET is subjected in the turning OFF process of the MOSFET. The disclosure in Patent Document 3 is further described in the following.

In the superjunction semiconductor device manufactured by a multi-stage epitaxial growth method, the impurity concentration in the upper portion of an n type semiconductor layer, i.e., an n type column, composing a parallel pn layer is 1.5 to 2.0 times higher than that in the lower portion of the n type column, to make a depletion layer hardly extend in turning OFF operation. Thus, the trade-off relationship between the Eoff and the turning OFF dV/dt is improved.

In the superjunction semiconductor device manufactured by a trench embedding method, on the other hand, the impurity concentration of a p type semiconductor layer, i.e., a p type column, is enhanced in a portion from the top surface to a position in a range of 1/1.5 to 1/3 of the trench depth. The impurity concentration in the surface region of an n type column of an epitaxial layer is made 1.2 to 3.0 times higher than that in the lower portion of the n type column. The p type columns and the n type columns compose a parallel pn layer having a superjunction structure by the trench embedding method. Thus formed parallel pn layer having a superjunction structure improves the trade-off relationship between the Eoff and the turning OFF dV/dt.

Patent Document 4 discloses a method of forming a parallel pn layer having a superjunction structure by a trench embedding method employing a trench with an aspect ratio at lease 8. The disclosure of Patent Document 4 is described in more detail in the following.

In the method disclosed in Patent Document 4, a trench with a taper at the top thereof is formed in the first conductivity type semiconductor substrate and, on the taper, first conductivity type impurities are ion-implanted. After that, the trench is filled with an epitaxial layer of the second conductivity type. Thus, a parallel pn layer is formed. On the surface of the parallel pn layer, a semiconductor layer of the second conductivity type is formed. In the surface region of this semiconductor layer, an emitter layer, or a source layer, is formed on which a gate electrode is formed.

The tapered configuration allows plenty of impurities to be injection by oblique implantation to this place, and compensates for the amount of impurities decreased due to removed volume by forming the taper. Consequently, charge balance in the tapered portion of the parallel pn layer is held thereby avoiding drop of a withstand voltage.

Patent Document 5 discloses that the impurity concentration in an n type semiconductor layer, i.e. an n type column, is adjusted by two or more times of ion implantation with varied tilting angles into a side wall of a trench.

FIG. 20 shows schematically the relationship between the Eoff and the turning OFF dV/dt. Improvement of the trade-off relationship is represented by transfer of the curve Z in the direction of the arrow toward smaller values of the Eoff and the turning OFF dV/dt.

However, in order to manufacture a superjunction semiconductor device 500, as shown in FIG. 16 and disclosed in Patent Document 3, by means of multi-stage epitaxial growth, five or six steps need to be repeated including a step of epitaxial growth, a step of ion implantation for n type impurity ion implantation, a step of photolithography, and a step of ion implantation for p type impurity ion implantation. This procedure needs multiple steps and high cost.

The trench embedding method disclosed in Patent Document 3 forms a high concentration n type epitaxial layer on a low concentration n type epitaxial layer before forming a trench. Because the epitaxial growth method is employed for forming the high concentration n type semiconductor layer, the method of Patent Document 3 is costly.

In the method of Patent Document 4, the high concentration n type semiconductor layer is formed in order to obtain charge balance in the tapered part. Because a p base layer is formed on this tapered part, the impurity concentration in the n type column under the p base layer is homogeneous, and thus, the effect for improving the trade-off relationship between the Eoff and the turning OFF dV/dt is little.

None of Patent Documents 1 through 5 discloses or suggests making an upper portion of the n type semiconductor layer i.e., n type column, composing the parallel pn layer to be high impurity concentration by means of ion implantation in the process of forming the parallel pn layer having a superjunction structure in the trench embedding method. In addition, none of Patent Documents 1 through 5 discloses or suggests that the trade-off relationship between the Eoff and the turning OFF dV/dt is improved by forming a high concentration n type semiconductor layer in the upper portion of an n type semiconductor layer, i.e., n type column, employing an ion implantation process.

The present invention is directed to overcoming or at least reducing the effects of one or more of the problems set forth above.

SUMMARY OF THE INVENTION

The present invention has been made in view of the foregoing and provides a semiconductor device and a method of manufacturing the semiconductor device in which the trade-off relationship between the Eoff and the turning OFF dV/dt is improved at a low cost using a trench embedding method.

A superjunction semiconductor device of a first aspect of the present invention comprises: a semiconductor substrate of a first conductivity type; a first conductivity type semiconductor layer disposed on the semiconductor substrate; a plurality of trenches disposed in the first conductivity type semiconductor layer; a second conductivity type semiconductor layer embedded in the trench; a parallel pn layer composed of the first conductivity type semiconductor layer and the second conductivity type semiconductor layer in contact with the first conductivity type semiconductor layer, the first and second semiconductor layers being alternately arranged in a horizontal direction, which is parallel to a principal surface of the semiconductor substrate; and a high concentration first conductivity type semiconductor region provided in an upper part of the first conductivity type semiconductor layer, the high concentration first conductivity type semiconductor region having an impurity concentration higher than the one in a lower part of the first conductivity type semiconductor layer and being in contact with the second conductivity type semiconductor layer; wherein in the high concentration first conductivity type semiconductor region along the direction parallel to the principal surface of the semiconductor substrate, the impurity concentration of the high concentration first conductivity type semiconductor region is higher at a side in contact with the second conductivity type semiconductor layer than at a central side; and an average thickness of the high concentration first conductivity type semiconductor region is at most ½ of the distance from a top surface of the first conductivity type semiconductor layer to a bottom surface of the second conductivity type semiconductor layer.

The superjunction semiconductor device of a second aspect of the present invention is the semiconductor device of the first aspect of the invention wherein distribution of impurity concentration in the high concentration first conductivity type semiconductor region is preferably error function distribution in the horizontal direction, which is parallel to the principal surface of the semiconductor substrate.

The superjunction semiconductor device of a third aspect of the present invention is the semiconductor device of the first or second aspect of the invention wherein an average thickness of the high concentration first conductivity type semiconductor region is preferably at most ¼ of the distance from the top surface of the first conductivity type semiconductor layer to the bottom surface of the second conductivity type semiconductor layer.

The superjunction semiconductor device of a fourth aspect of the present invention is the semiconductor device of any one of the first through third aspects of the invention wherein the bottom surface of the high concentration first conductivity type semiconductor region is preferably exhibits a wavy configuration.

A method of manufacturing a semiconductor device of a fifth aspect of the present invention manufactures a semiconductor device having a junction structure, the semiconductor device comprising; a semiconductor substrate of a first conductivity type; a first conductivity type semiconductor layer disposed on the semiconductor substrate; a plurality of trenches disposed in the first conductivity type semiconductor layer; a second conductivity type semiconductor layer embedded in the trench; a parallel pn layer composed of the first conductivity type semiconductor layer and the second conductivity type semiconductor layer in contact with the first conductivity type semiconductor layer, the first and second semiconductor layers being alternately arranged in a horizontal direction, which is parallel to a principal surface of the semiconductor substrate; and a high concentration first conductivity type semiconductor region provided in an upper part of the first conductivity type semiconductor layer, the high concentration first conductivity type semiconductor region having an impurity concentration higher than the one in a lower part of the first conductivity type semiconductor layer; the method comprising steps of: forming a trench(s) in the first conductivity type semiconductor layer; ion-implanting first conductivity type impurities on an upper part of a side wall of the trench by an oblique ion implantation process; filling the trench with the second conductivity type semiconductor layer; and forming the high concentration first conductivity type semiconductor region by a heat-treatment process.

The method of manufacturing a semiconductor device of a sixth aspect of the present invention is the method of the fifth aspect of the invention wherein the heat treatment process is preferably conducted after the ion implantation process and before filling the trench with the second conductivity semiconductor layer.

The method of manufacturing a semiconductor device of a seventh aspect of the present invention is the method of the fifth aspect of the invention wherein the heat treatment process is preferably conducted the ion implantation process and after filling the trench with the second conductivity semiconductor layer.

The method of manufacturing a semiconductor device of an eighth aspect of the present invention is the method of any one of the fifth through seventh aspects of the invention wherein an incident angle θ(°) of the ion implantation with respect to the principal surface of the semiconductor substrate, a width W (μm) of an opening of the trench, and a depth L (μm) of the trench preferably satisfy an inequality: $\theta \leq \tan^{-1}(L/(2W))$.

The method of manufacturing a semiconductor device of a ninth aspect of the present invention is the method of any one of the fifth through seventh aspect of the invention wherein the thickness of the high concentration first conductivity type semiconductor region from a top surface of the first conductivity type semiconductor layer is preferably at most ½ of a depth of the trench.

The method of manufacturing a semiconductor device of a tenth aspect of the present invention is the method of the ninth aspect of the invention wherein the thickness of the high concentration first conductivity type semiconductor region from the top surface of the first conductivity type semiconductor layer is preferably at most ¼ of the depth of the trench.

The present invention as stated above provides a semiconductor device that improves the trade-off relationship between the Eoff and the turning OFF dV/dt by forming a high concentration n type semiconductor region in the upper portion of an n type layer of the parallel pn layer, the impurity concentration of the region being higher at the p type layer side than at the center of the n type layer.

The present invention as stated above provides a method for manufacturing a semiconductor device that improves the trade-off relationship between the Eoff and the turning OFF dV/dt by forming a parallel pn layer having a superjunction structure employing a trench embedding method, and conducting ion implantation process into the upper portion of an n type semiconductor layer, i.e. an n type column, to form a high concentration n type semiconductor region.

Because the redundant repeating of steps as in the conventional multi-stage epitaxial growth method has been eliminated, the procedure has been shortened and the manufacturing costs has been reduced in the method of the invention.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

The following describes in detail some preferred embodiments of the invention with reference to accompanying drawings.

Embodiment Example 1

Figure 1A:
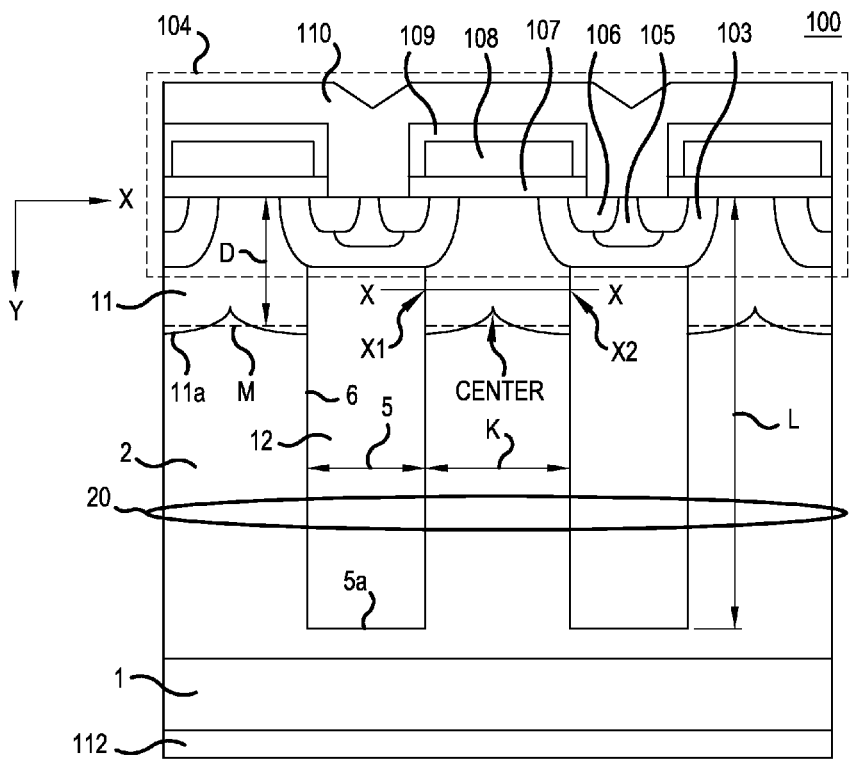
FIG. 1A is a sectional view of an essential part of a semiconductor device 100 according to a first embodiment of the invention.
Figure 1B:
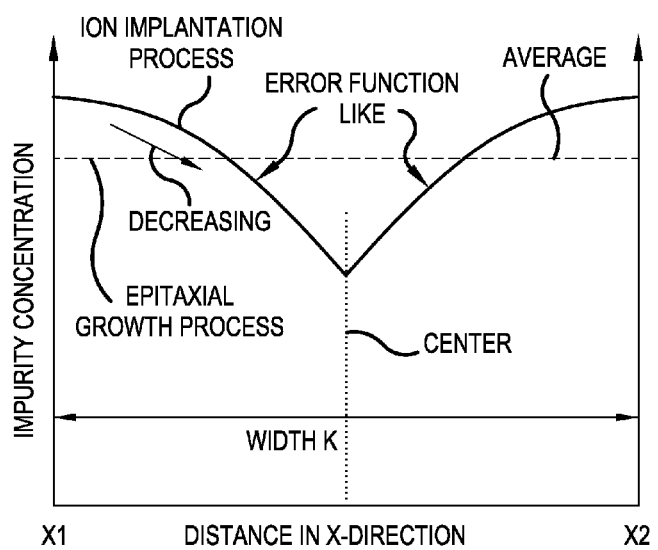
FIG. 1B is a graph showing an impurity concentration profile along the line X-X in FIG. 1A.

FIGS. 1A and 1B are drawings for explaining semiconductor device 100 according to an Embodiment Example 1 of the present invention, wherein FIG. 1A is a sectional view of an essential part of semiconductor device 100 and FIG. 1B is a graph showing a profile of impurity concentration along a lateral direction in a high concentration n type semiconductor region. The semiconductor device of FIG. 1A is an example of a superjunction (SJ) MOSFET. The ordinate of FIG. 1B represents an impurity concentration in a logarithmic scale, and shows impurity concentrations for X1 and X2 from FIG. 1A.

Device surface structure 104 is formed on a first principal surface, which is a top surface of parallel pn layer 20, of semiconductor device 100. The device surface structure comprises: p base region 103, $p^+$ contact region 105, and $n^+$ source region 106. Gate electrode 108 is formed through gate insulation film 107 on the surface of p base region 103 between n type semiconductor layer 2 and $n^+$ source region 106. Interlayer dielectric film 109 is formed covering gate electrode 108. The device surface structure is also provided with source electrode 110 in contact with $n^+$ source region 106 and $p^+$ contact region 105.

Drain electrode 112 is provided on the second principal surface, which is a back surface of n type semiconductor substrate 1, of semiconductor device 100.

Parallel pn layer 20 is provided between device surface structure 104 and n type semiconductor substrate 1. On n type semiconductor layer 2, i.e., the n type column of parallel pn layer 20, high concentration n type semiconductor region 11 is formed by ion implantation.

FIG. 1B shows a distribution of impurity concentration, an impurity concentration profile along the lateral direction, the X-direction, of high concentration n type semiconductor region 11 formed by means of ion implantation according to an embodiment of the invention. Because high concentration n type semiconductor region 11 is formed by driving the ion-implanted impurities injected into side wall 6 by means of a heat treatment process, the impurity concentration profile is not flat as indicated by the dotted line, like in the case of a semiconductor region formed by epitaxial growth, but like an error function.

In this impurity concentration profile, the impurity concentration is highest at side wall 6 of trench 5 and decreases along the lateral line toward the center of high concentration n type semiconductor region 11. Bottom surface 11a of high concentration n type semiconductor region 11 has a configuration, as shown in FIG. 1A, of a wave form with upward depression at the center of the region. The dotted line in FIG. 1B shows a constant impurity concentration profile along the X-direction of a high concentration n type semiconductor region formed by an epitaxial growth method and containing the same total amount of impurities as that of high concentration n type semiconductor region 11. A reason for comparison with the epitaxially grown layer containing the same total amount of impurities is because the comparison is to be made between SJ-MOSFETs with the equal withstand voltage. The dotted line also indicates an average impurity concentration of high concentration n type semiconductor region 11 formed by an ion implantation method.

A depletion layer tends to hardly expand as the impurity concentration becomes high. High concentration n type semiconductor region 11 formed by ion implantation exhibits an impurity concentration distribution, i.e., profile, like an error function and highest at side wall 6 of trench 5. Thus, the depletion layer extending from side wall 6 of trench 5 does not expand readily in this high concentration n type semiconductor region 11. As a result, it takes longer time for the whole parallel pn layer 20 including high concentration n type semiconductor region 11 to be completely depleted than for the parallel pn layer comprising an epitaxially grown layer containing the same amount of impurities. This means that the turning OFF dV/dt is gentle. On the other hand, the Eoff changes little because the external gate resistance connected to the gate of the SJ-MOSFET does not change. Therefore, the trade-off relationship between the Eoff and the turning OFF dV/dt is improved. An experiment has shown that a magnitude of the turning OFF dV/dt decreases to about half under the condition of the same Eoff. For the same turning OFF dV/dt, the Eoff can be decreased, which achieves reduction of energy loss generated in an SJ-MOSFET.

If a high concentration n type semiconductor region is to be formed by epitaxial growth, a device must be designed in consideration of large scattering of the impurity concentration in the epitaxial growth process. Such a design raises a manufacturing cost, and thus substantially discounts the cost reduction effect from a conventional SJ-MOSFET. In contrast, high concentration n type semiconductor region 11 formed by ion implantation according to an embodiment of the invention exhibits scattering of impurity concentration of at most several percent, and thus achieves cost reduction and high accuracy as compared with a high concentration n type semiconductor region fabricated by epitaxial growth.

Figure 15:
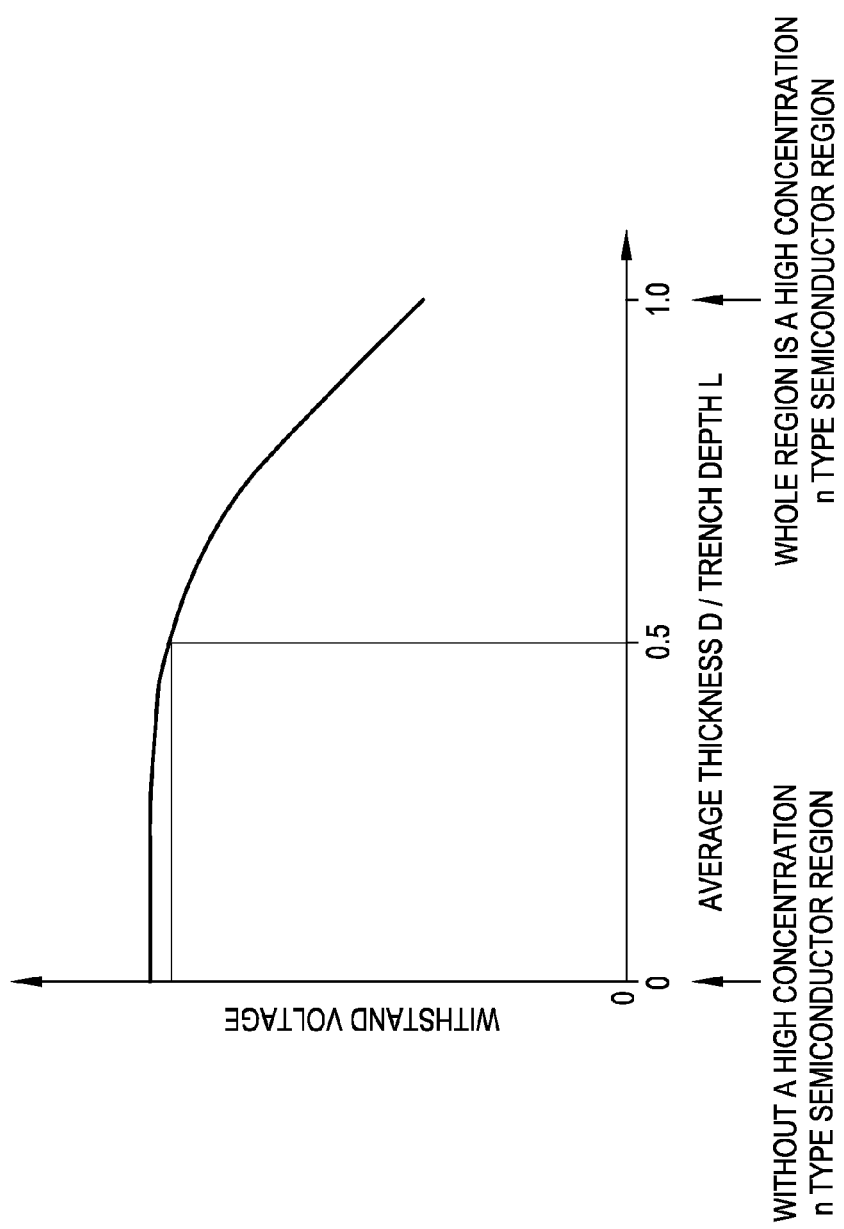
FIG. 15 shows the relationship, based on a simulation result, between a withstand voltage and a ratio D/L where D is an average thickness of the high concentration semiconductor region 11 and L is the trench depth.
Figure 16:
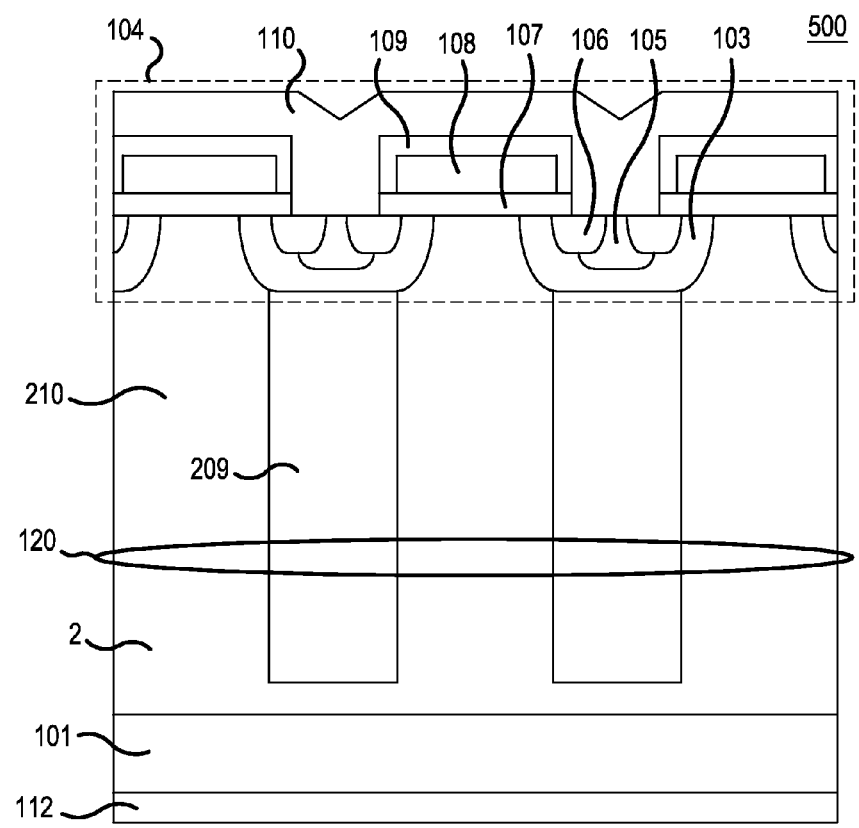
FIG. 16 is a sectional view of an essential part of a conventional superjunction semiconductor device 500.

FIG. 15 shows the relationship, based on a simulation result, between a withstand voltage and a ratio D/L where D is an average thickness of high concentration semiconductor region 11 and L is the trench depth. The simulation is executed under the conditions of a constant thickness D of high concentration n type semiconductor region 11 and a constant impurity concentration in high concentration n type semiconductor region 11. In order to improve the trade-off relationship between the Eoff and the turning OFF dV/dt, it is preferable to make the ratio of the average thickness D to the trench depth L not larger than ½, where the average depth D is an average value of the distance from the top surface of parallel pn layer 20 to the bottom surface of high concentration n type semiconductor region 11. As shown in FIG. 15, the ratio D/L larger than ½ deteriorates a charge balance in parallel pn layer 20, lowering the withstand voltage.

It is more preferable to make this ratio D/L below ¼ because the charge balance is more improved and the withstand voltage is prevented from lowering. However, excessively thin width discounts the dV/dt reduction effect, and thus, the ratio D/L is preferably at least ⅛.

Embodiment Example 2

Figure 2A:
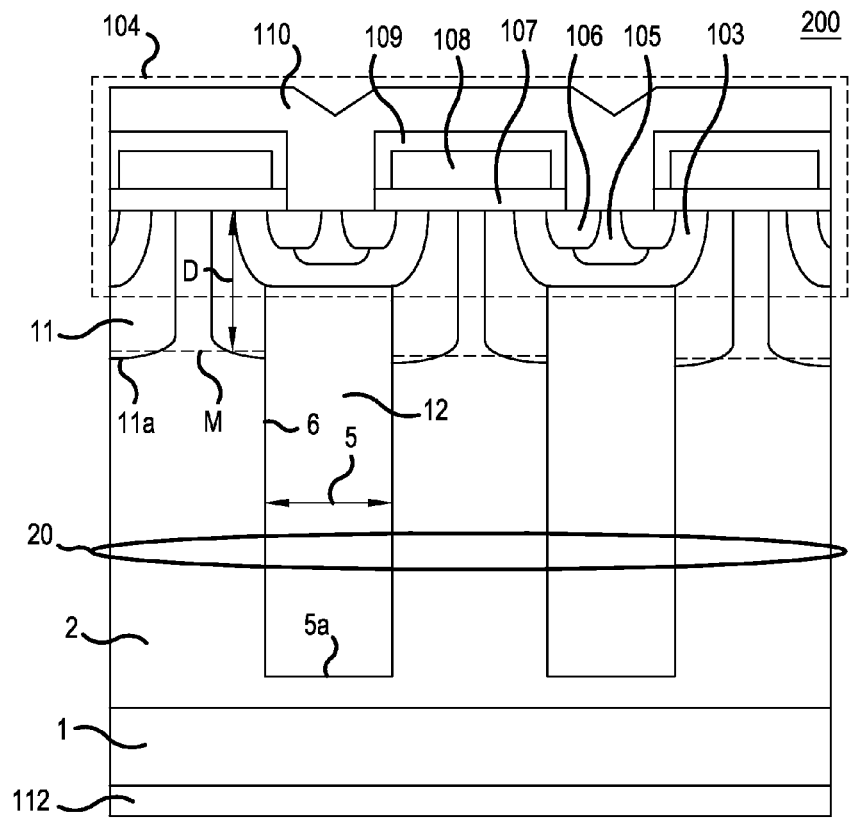
FIG. 2A is a sectional view of an essential part of a semiconductor device 200 according to a second embodiment of the invention.
Figure 2B:
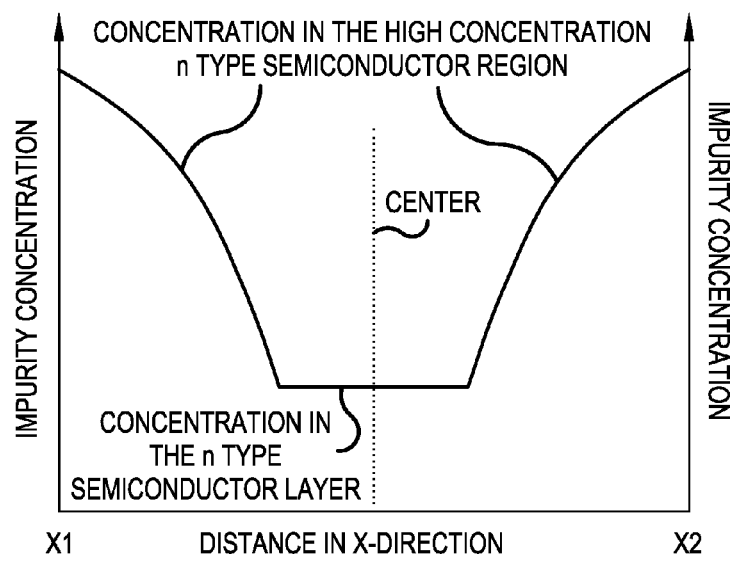
FIG. 2B is a graph showing an impurity concentration profile along the lateral direction in a high concentration n type semiconductor region.

FIGS. 2A and 2B illustrate semiconductor device 200 according to Embodiment Example 2 of the present invention, wherein FIG. 2A is a sectional view of an essential part of semiconductor device 200 and FIG. 2B is an impurity concentration profile along the lateral direction in the high concentration n type semiconductor region. The ordinate of FIG. 2B represents the impurity concentration in a logarithmic scale.

The semiconductor device of FIGS. 2A and 2B is different from the device of FIGS. 1A and 1B in that the device of FIGS. 2A and 2B lacks a central part of high concentration n type semiconductor region 11. This construction also has the same effects as the construction of FIGS. 1A and 1B. In this construction, a heat treatment step for forming high concentration n type semiconductor region 11 can be conducted after embedding p type semiconductor layer 12 into trench 5. This heat treatment process can be carried out, at the same time as a heat treatment process for forming p base region 103 and $n^+$ source region 106 in the step (9) of the procedure for manufacturing a semiconductor device according to an embodiment of the invention, which will be described afterwards with reference to FIG. 11. Phosphorus impurities 7 (indicated in FIG. 5) injected by the ion implantation may also diffuse into p type semiconductor layer 12, but the phosphor impurities diffused into the upper part of p type semiconductor layer 12 do not expand laterally over the whole range of the upper part of p type semiconductor layer 12. Therefore, the withstand voltage is not lowered.

Embodiment Example 3

FIGS. 3 through 11 are sectional views of an essential part of a semiconductor device in the method of manufacturing the semiconductor device according to Embodiment Example 3 of the present invention showing in the sequence of manufacturing steps.

Figure 3:
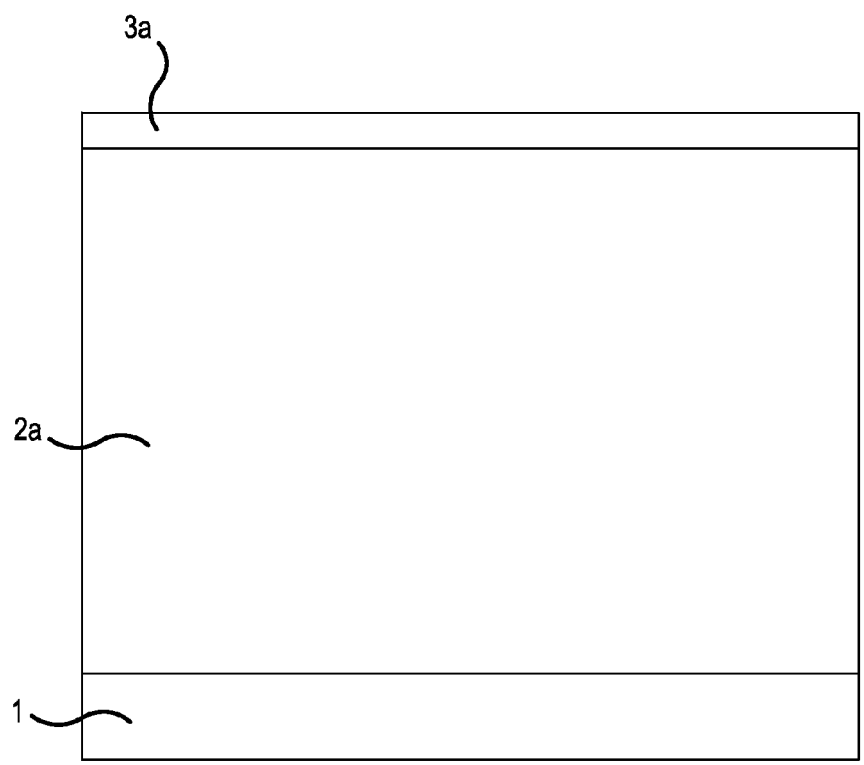
FIG. 3 is a sectional view showing an essential part of a semiconductor device according to a third embodiment of the invention.

(1) First, as shown in FIG. 3, on n type semiconductor substrate 1, which can be a silicon substrate and becomes a high concentration n type drain layer, n type semiconductor layer 2a, which can be a silicon layer, is formed by epitaxial growth to a thickness of about 45 μm, for example. Then oxide layer 3a, which can be $SiO_2$, is formed on n type semiconductor layer 2a.

Figure 4:
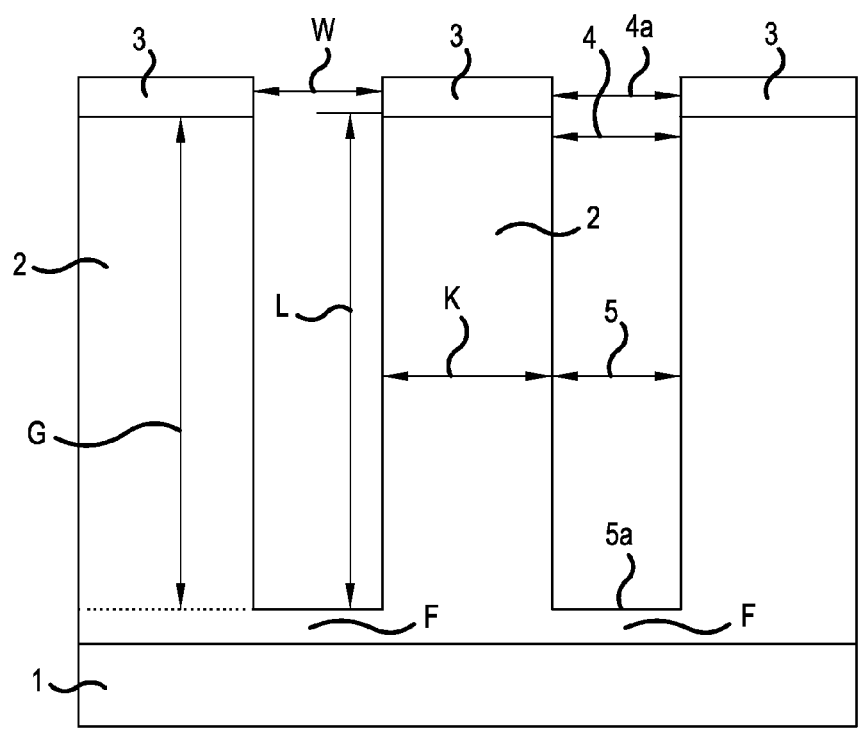
FIG. 4 is a sectional view showing an essential part of a semiconductor device in a step of manufacturing the device following the step of FIG. 3, according to the third embodiment of the invention.
Figure 12:
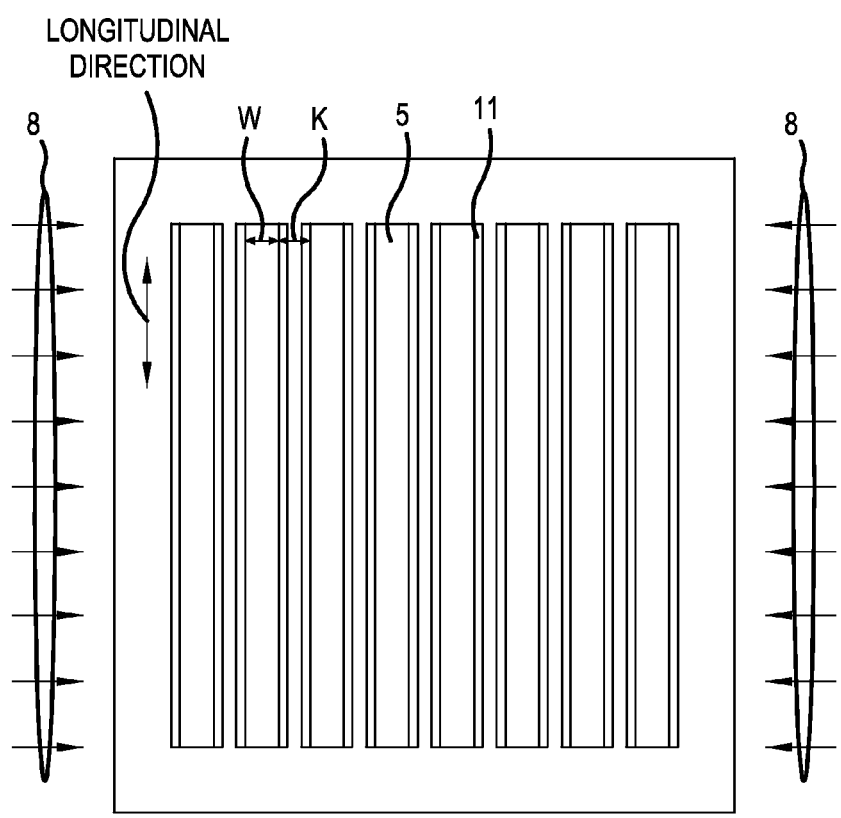
FIG. 12 is a planar view of an essential part of places for ion implantation.

(2) Then, as shown in FIG. 4, oxide film 3 having openings 4a is formed by patterning oxide film 3a using a photolithography technique. The planar pattern here is for example, a line-and-space configuration with an opening width W of 6 μm and a repetition pitch T (indicated in FIG. 6), i.e., an SJ pitch, of 12 μm. The line-and-space configuration is, as shown in FIG. 12, composed of trenches 5 with a planar shape of stripe and pillars K with a stripe shape interposed between trenches 5. N type semiconductor layer 2a exposing through opening 4a is etched from the surface of n type semiconductor layer 2a by means of a dry etching process of ion chemical polishing (ICP) to form trenches 5 with openings 4 having a width of 6 μm and a depth L of about 40 μm using a mask of oxide film 3 having openings 4a. A portion of n type semiconductor layer 2a remains with a thickness of about 5 μm in a space F between semiconductor substrate 1 and bottom surface 5a of trench 5. The aspect ratio of the trench 5 is 40 μm/6 μm≈7. N type semiconductor layer 2a after forming trenches 5 becomes n type semiconductor layer 2, and n type semiconductor layer 2 becomes an n type columns G except for the F portion.

Figure 5:
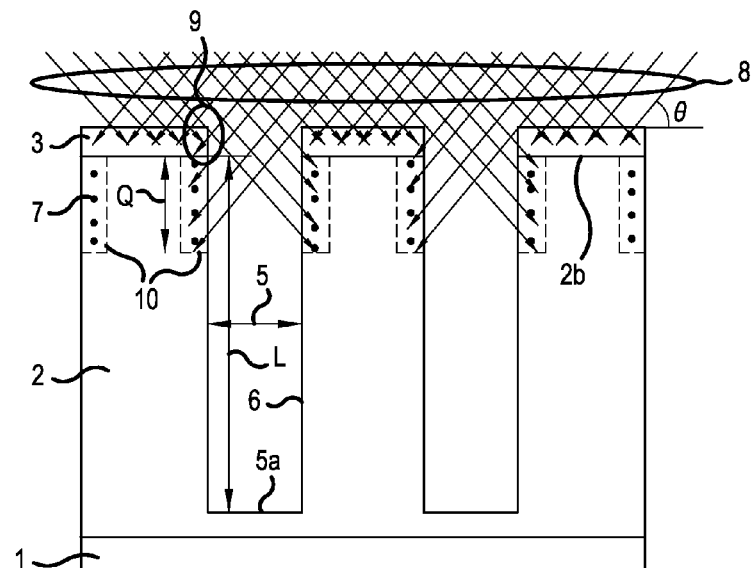
FIG. 5 is a sectional view showing an essential part of a semiconductor device in a step of manufacturing the device following the step of FIG. 4, according to the third embodiment of the invention.

(3) Then, as shown in FIG. 5, phosphor impurities 7 are injected obliquely toward the upper part of side wall 6 of trench 5 by means of oblique ion implantation process. Oblique ion implantation 8 is conducted with an oblique incident angle θ of 49° with respect to surface 2b of n type semiconductor layer 2 or the surface of oxide film 3. Due to the shadowing effect, or masking effect, of the shoulder of trench 5 at the top of opening 4, n type impurities of phosphor impurities 7 are injected to a depth of 7 μm of side wall 6 of trench 5, forming ion implantation layer 10 in the upper part of the side wall of trench 5. The length Q of ion implantation layer 10 of 7 μm is a proportion of 7/40=0.18 with respect to the trench length L.

The ion implantation is scarcely conducted on the part of side wall 6 of trench 5 deeper than the length Q (=7 μm) of ion implantation layer 10. FIG. 12 is a plan view of an essential part of the implanted area by ion implantation 8. Ion impurities 7 are injected onto the upper part of side wall 6 through opening 4, forming ion implantation layer 10 on side wall 6 extending along opening 4 of trench 5. Phosphor impurities 7 are not injected to the lower part of side wall 6 and bottom surface 5a of trench 5. Whereas the phosphor impurities are not injected to the longitudinal ends of trench 5, a heat treatment process after the ion implantation drives diffusion of phosphor impurities 7 in the lateral direction. As a result, high concentration n type semiconductor region 11 is formed over the whole periphery of the upper part of side wall 6 of trench 5 after the heat treatment process. Even though some parts of the ends of the trench lack high concentration n type semiconductor region 11, the volume of such parts is insignificant as compared with the total volume of other parts extending along the longitudinal direction of trench 5. Therefore, charge balance is hardly affected.

In the above description, the incident angle θ is 49° for ion implantation 8. However, the oblique ion implantation in the invention necessarily conducts ion implantation onto a part Q that is at most half of the length from the upper end at opening 4 to the bottom of side wall 6 of trench 5.

The incident angle θ with respect to the semiconductor surface can be obtained by simple geometric calculation. For a trench with an opening width W [μm] and a depth L [μm], an incident angle θ in the ion implantation satisfying the inequality (1) below forms ion implantation layer 10 with a length Q that is at most half of the depth L of trench 5.

$$\theta \leq \tan^{-1}[L/(2W)] \quad (1)$$

The opening width W, which is a trench width, is 6 μm in the above description. The opening width W, however, can be narrowed together with the pitch T, which improves the trade-off relationship between the withstand voltage and the ON resistance. When the opening width W is 4 μm and the depth L is unchanged (L=40 μm), the incident angle θ of the ion implantation should be θ≤78.7° corresponding to the condition Q/L≤½. When the width W is kept constant, then the incident angle θ increases as the trench depth L increases. If the thickness d of the mask is taken into consideration, the condition of the formula (1) slightly changes. However, the thickness d is about 1 μm and much smaller than the depth L of 40 μm. Thus, $\tan^{-1}[(L+d)/(2W)] \approx \tan^{-1}[L/(2W)]$.

Figure 6:
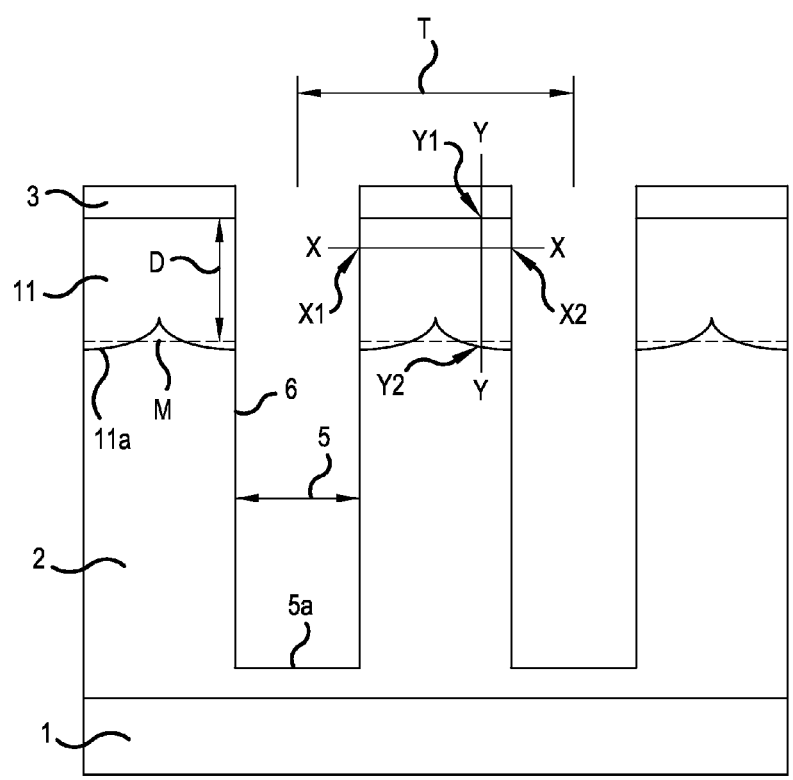
FIG. 6 is a sectional view showing an essential part of a semiconductor device in a step of manufacturing the device following the step of FIG. 5, according to the third embodiment of the invention.

(4) Then as shown in FIG. 6, a heat treatment process is conducted for driving diffusion of phosphor impurities 7 in ion implanted layer 10 to form high concentration n type semiconductor region 11. Since the average thickness D of high concentration n type semiconductor region 11 is nearly equal to the length Q of ion implantation layer 10, the ratio of the average thickness D to the trench depth L is 7 μm/40 μm≈⅙. In the present invention, high concentration n type semiconductor region 11 is formed in the upper region of n type semiconductor layer 2 by ion implantation, and the ratio of the average thickness D of high concentration n type semiconductor region 11 to the trench depth L is made at most ½. The average thickness D of high concentration n type semiconductor region 11 is controlled by adjusting the incident angel 8 so as to result the ratio of the thickness D to the depth L within the specified range of ½.

The ratio of the average thickness D of high concentration n type semiconductor region 11 to the trench depth L is necessarily at most ½, but preferably at most ¼. The effect of gentle turning OFF dV/dt is obtained even in the structure of FIG. 2 which lacks high concentration n type semiconductor region 11 in the middle of n type semiconductor layer 2 or the n type column G (indicated in FIG. 4). The average thickness D of high concentration n type semiconductor region 11 here is defined as a distance to a plane M from the surface of high concentration n type semiconductor region 11, the plane M being a plane on which the impurity concentration is an average value along wavy bottom plane 11a of high concentration n type semiconductor region 11. This average thickness D is nearly equal to the length Q of ion implantation layer 10. Reference symbol T indicated in FIG. 6 is the pitch of trench 5.

Figure 7:
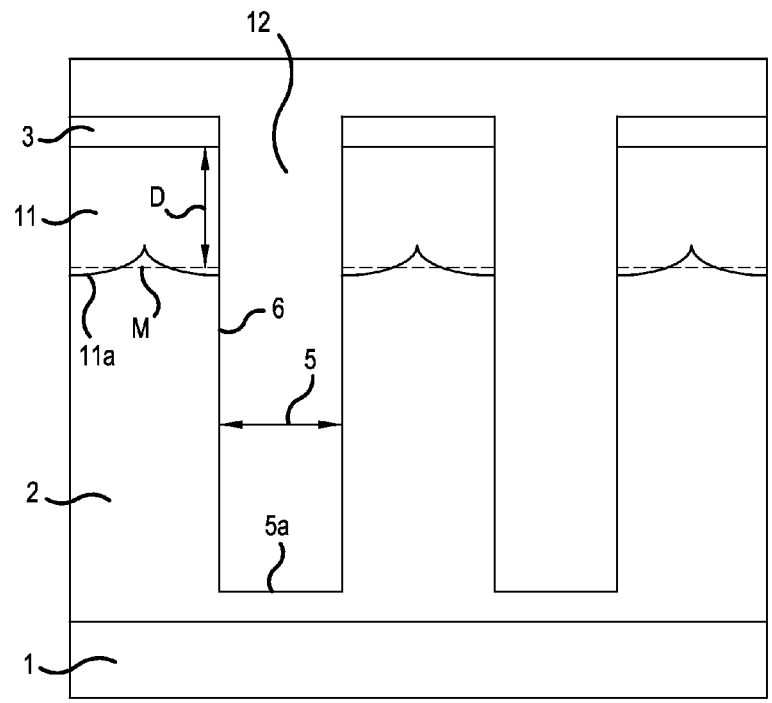
FIG. 7 is a sectional view showing an essential part of a semiconductor device in a step of manufacturing the device following the step of FIG. 6, according to the third embodiment of the invention.

(5) Then as shown in FIG. 7, p type semiconductor layer 12, i.e., p type column, with a homogeneous impurity concentration is embedded in trench 5 by an epitaxial growth process. This p type semiconductor layer 12 has the homogeneous impurity concentration that is in charge balance with that of n type semiconductor layer 2, i.e., n type column. The charge balance allows n type semiconductor layer 2 and p type semiconductor layer 12 to be depleted nearly at the same time in the whole of the both layers. P type semiconductor layer 12 completely fills trench 5 in this filling process and further is deposited on the whole surface including on oxide film 3 as shown in FIG. 7.

Figure 8:
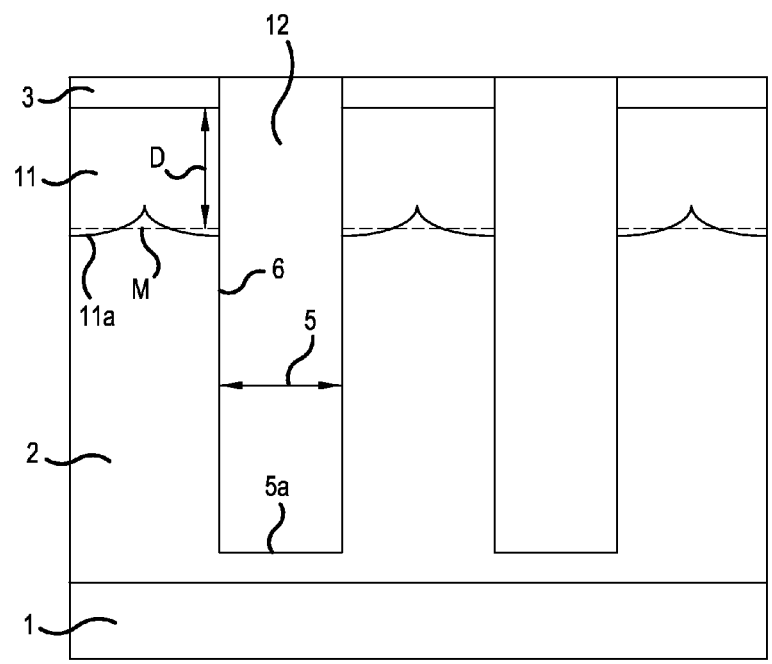
FIG. 8 is a sectional view showing an essential part of a semiconductor device in a step of manufacturing the device following the step of FIG. 7, according to the third embodiment of the invention.

(6) Then, as shown in FIG. 8, p type semiconductor layer 12 is removed by a chemical mechanical polishing (CMP) process until oxide film 3 is exposed.

Figure 9:
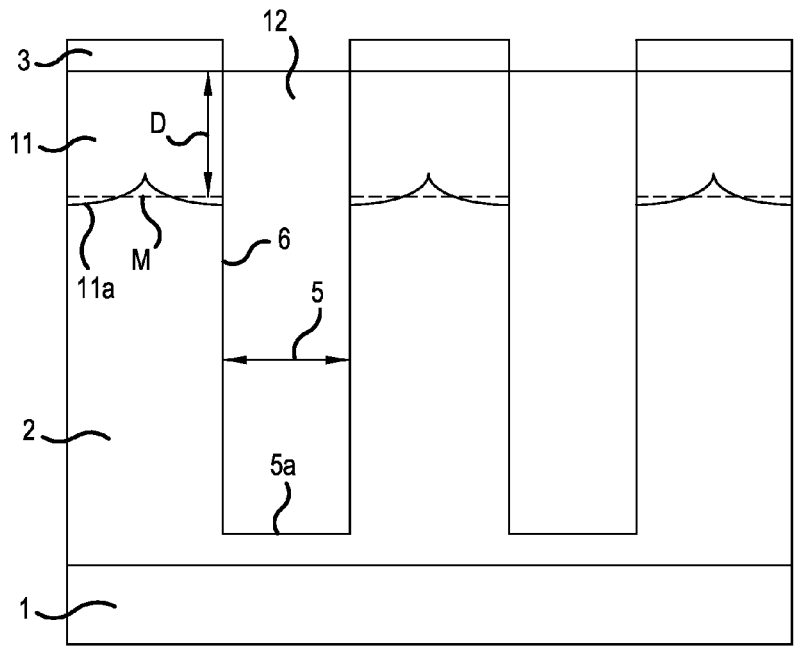
FIG. 9 is a sectional view showing an essential part of a semiconductor device in a step of manufacturing the device following the step of FIG. 8, according to the third embodiment of the invention.

(7) Then, as shown in FIG. 9, the upper part of p type semiconductor layer 12 is etched back to level its height to that of n type semiconductor layer 2.

Figure 10:
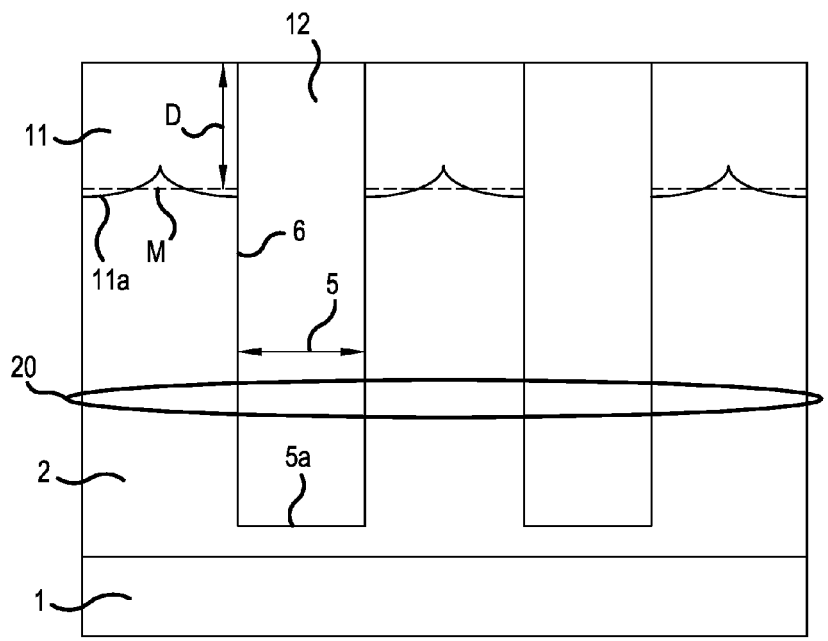
FIG. 10 is a sectional view showing an essential part of a semiconductor device in a step of manufacturing the device following the step of FIG. 9, according to the third embodiment of the invention.

(8) Then as shown in FIG. 10, oxide film 3 is removed with hydrofluoric acid, for example. The steps thus far form parallel pn layer 20 having high concentration n type semiconductor region 11 in the upper part thereof.

Figure 17:
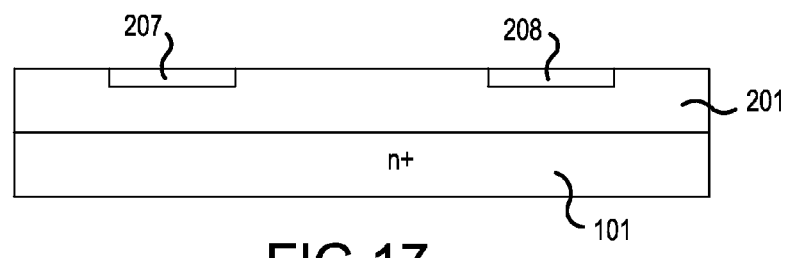
FIG. 17 is a sectional view showing a step in forming parallel pn layer 120 of the superjunction semiconductor device of FIG. 16.
Figure 18:
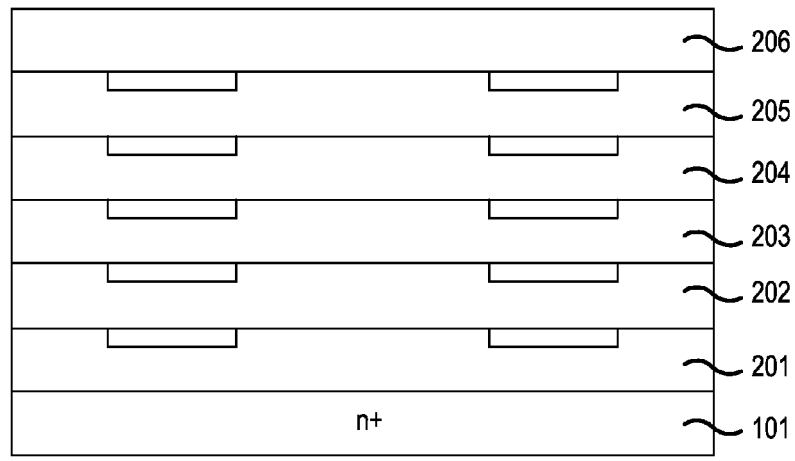
FIG. 18 is a sectional view showing a step following the step of FIG. 17 in forming parallel pn layer 120 of the superjunction semiconductor device of FIG. 16.
Figure 19:
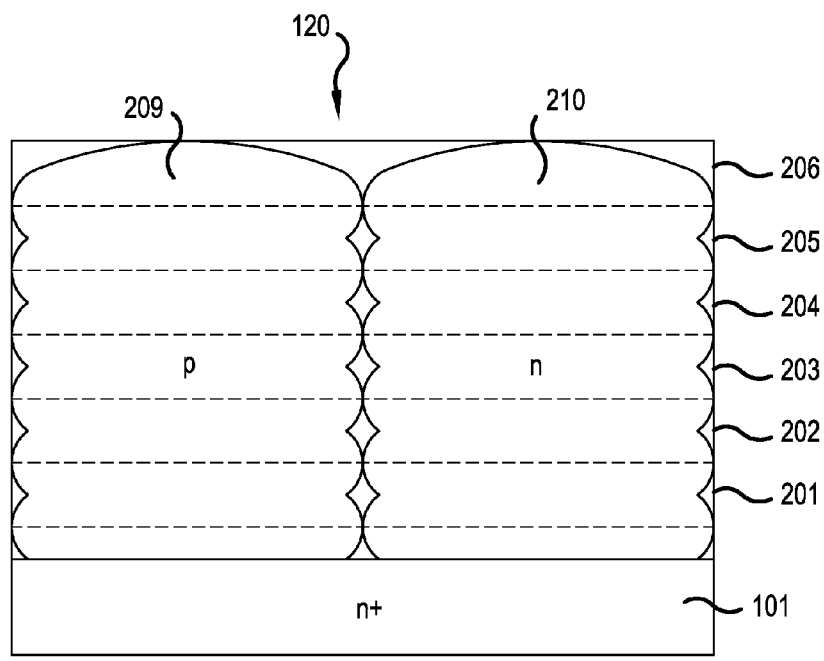
FIG. 19 is a sectional view showing a step following the step of FIG. 18 in forming parallel pn layer 120 of the superjunction semiconductor device of FIG. 16.
Figure 20:
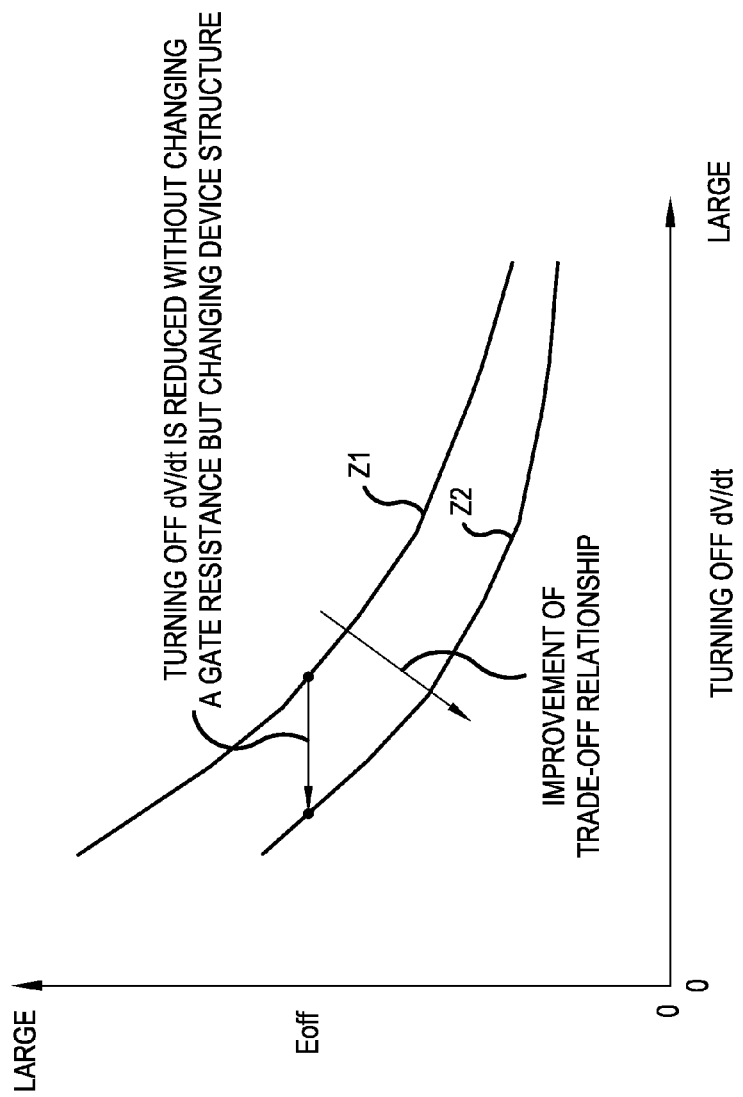
FIG. 20 illustrates schematically the trade-off relationship between the Eoff and the turning OFF dV/dt.

The trench embedding method described above for forming parallel pn layer 20 shortens the manufacturing procedure and reduces manufacturing costs because the trench embedding method simplifies the procedure shown in FIG. 18 in which the step shown in FIG. 17 is repeated conducting sequentially a step of epitaxial growth, a step of ion implantation, a step of lithography, and another step of ion implantation.

Figure 11:
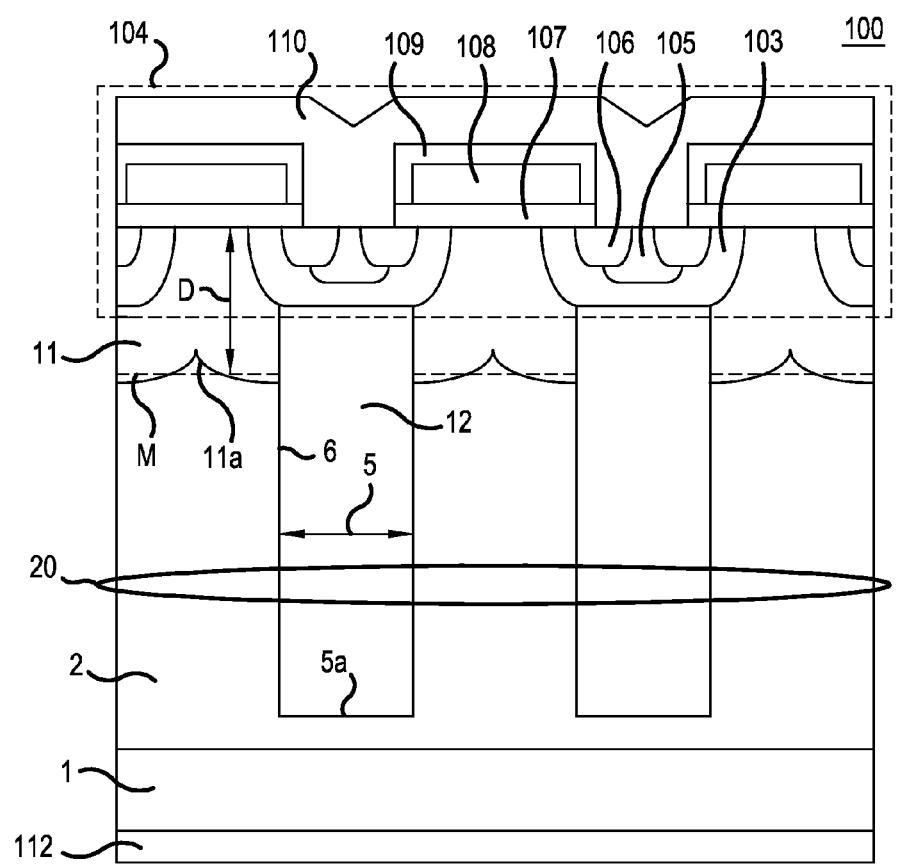
FIG. 11 is a sectional view showing an essential part of a semiconductor device in a step of manufacturing the device following the step of FIG. 10, according to the third embodiment of the invention.

(9) After completion of parallel pn layer 20 as shown in FIG. 10, device surface structure 104 is formed on the first principal surface side of parallel pn layer 20 as shown in FIG. 11 by the steps similar to those for manufacturing a conventional MOSFET. First p base region 103 is formed followed by formation of p⁺ contact region 105 and n⁺ source region 106. Then the following are formed: gate insulation film 107, gate electrode 108, interlayer dielectric film 109, and source electrode 110. On the back surface, the second principal surface, of n type semiconductor substrate 1, drain electrode 112 in contact with substrate 1 is formed. Thus, an SJ-MOSFET is completed.

Ion implantation layer 10 formed in the vicinity of side wall 6 of trench 5 in the step (3) described above by oblique ion implantation 8 diffuses inside n type semiconductor layer 2 by step (4) of heat treatment, i.e., a driving step, and joins at the center forming high concentration n type semiconductor region 11. Depending on a heat treatment condition, high concentration n type semiconductor region 11 may be formed without joining at the center as shown in FIG. 2. Even in such a case, the effect is provided to improve the trade-off relationship between the Eoff and the turning OFF dV/dt. A large proportion of high concentration n type semiconductor region 11 in n type semiconductor layer 2, i.e., the n type column, though effective for reducing the turning OFF dV/dt, deteriorates charge balance resulting in decrease in a withstand voltage. Accordingly, the average thickness D of high concentration n type semiconductor region 11 is appropriately at most ½ of the trench depth L, and preferably at most ¼.

The heat treatment step after the ion implantation step can be carried out after embedding p type semiconductor layer 12 in trench 5. For example, the heat treatment step in step (9) for forming p base region 103 and $n^+$ source region 106 is simultaneously utilized for the heat treatment for driving ion implantation layer 10.

High concentration n type semiconductor region 11 formed according to an embodiment of the invention makes little and gentle the sharp turning OFF dV/dt that generates electromagnetic noise that has been problematic in conventional SJ-MOSFETs.

High concentration n type semiconductor region 11 formed by the ion implantation method according to an embodiment of the invention decreases the turning OFF dV/dt more than high concentration n type semiconductor region 11 formed by the epitaxial growth method as disclosed in Patent Document 3. Thus, the trade-off relationship between the Eoff and the turning OFF dV/dt is more improved.

The method for manufacturing a semiconductor device according to an embodiment of the invention shortens period and reduces costs for manufacturing the device because the method of the invention eliminates redundant repeat of steps that is the case in the manufacturing method by the conventional multi-step epitaxial growth method.

Therefore, a semiconductor device and a method for manufacturing the semiconductor device are provided that improve the trade-off relationship between the Eoff and the turning OFF dV/dt.

Figure 13A:
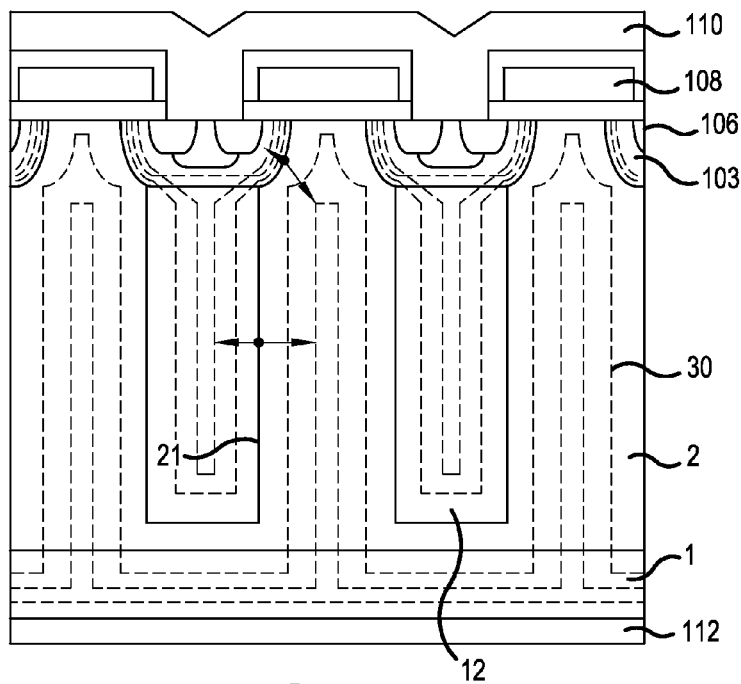
FIG. 13A shows expansion of depletion layer 30 in n type semiconductor layer 2, i.e., an n type column, in a semiconductor device without high concentration n type semiconductor region 11.
Figure 13B:
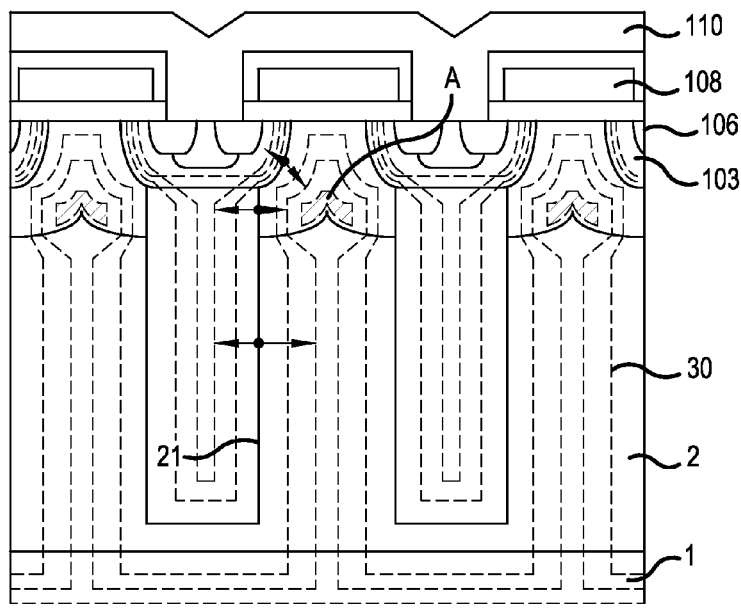
FIG. 13B shows expansion of a depletion layer 30 in n type semiconductor layer 2, i.e., an n type column, in a semiconductor device having high concentration n type semiconductor region 11 formed by ion implantation.

FIGS. 13A and 13B illustrate extension of depletion layer 30 in n type semiconductor layer 2, i.e., the n type column, in a case without a high concentration n type semiconductor region (FIG. 13A) and in a case with high concentration n type semiconductor region 11 formed by an ion implantation method (FIG. 13B). The arrows in the figures indicate the direction of extension of the front of depletion layer 30.

When a positive voltage is applied to the drain and a negative voltage is applied to the source of a device without high concentration n type semiconductor region 11 in the upper part of n type semiconductor layer 2 as shown in FIG. 13A, depletion layer 30 extends from the junction 21 between n type semiconductor layer 2, i.e., an n type column, and p base region 103 and p type semiconductor layer 12, i.e., p type column, into n type semiconductor layer 2 and into p type semiconductor layer 12. Because the depletion layer extends over the whole parallel pn layer 20 in a short time, a sharp turning OFF dV/dt results.

High concentration n type semiconductor region 11 formed in the upper part of n type semiconductor layer 2 by the ion implantation method has high impurity concentration in the vicinity of side wall 6 of trench 5. As a result, the depletion layer hardly extends, as shown in FIG. 13B, in the vicinity of side wall 6 of trench 5 in comparison with n type semiconductor layer 2 formed of an epitaxial layer having a homogeneous impurity concentration. Consequently, it takes a long time for the whole of parallel pn layer 20 to be depleted resulting in gentle turning OFF dV/dt. Owing to high concentration n type semiconductor region 11, after whole of p type semiconductor layer 12 is depleted, a part indicated by the shaded region 'A' in FIG. 13B of high concentration n type semiconductor region 11 remains undepleted.

When high concentration n type semiconductor region 11 is formed of an epitaxial layer having a total amount of impurities equal to that of high concentration n type semiconductor region 11 of FIG. 13B, mildness of the turning OFF dV/dt is in a middle between n type semiconductor layer 2 without high concentration n type semiconductor region 11 (FIG. 13A) and n type semiconductor layer 2 having high concentration n type semiconductor region 11 (FIG. 13B).

Because the gate resistance connected to the gate of the SJ-MOSFET is unchanged, the Eoff stays unchanged. As a consequence, the trade-off relationship between the Eoff and the turning OFF dV/dt is improved as compared with the case of an epitaxial layer.

High concentration n type semiconductor region 11 formed by the ion implantation method has the impurity concentration and the thickness thereof controlled more accurately than the one formed by an epitaxial growth method. As a result, a margin due to scattering of processes can be narrowed allowing marginal design, which achieves improvement in the trade-off relationship between a withstand voltage and an ON resistance, i.e., RonA, and enhancement of a rate of non-defective products.

Figure 14A:
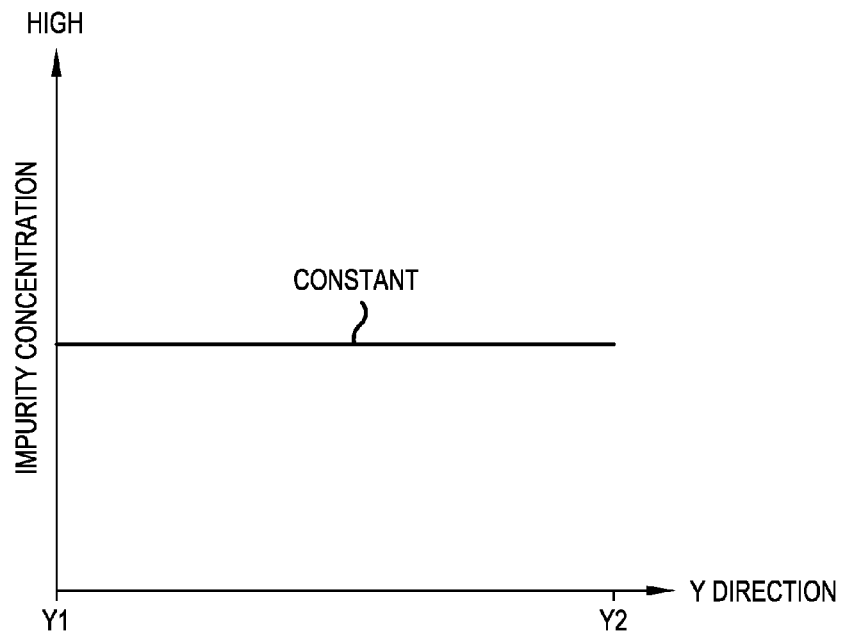
FIG. 14A is a graph showing a profile of impurity concentration in high concentration n type semiconductor region 11 formed by ion implantation in the upper part of n type semiconductor layer 2 along the line Y-Y in FIG. 6.
Figure 14B:
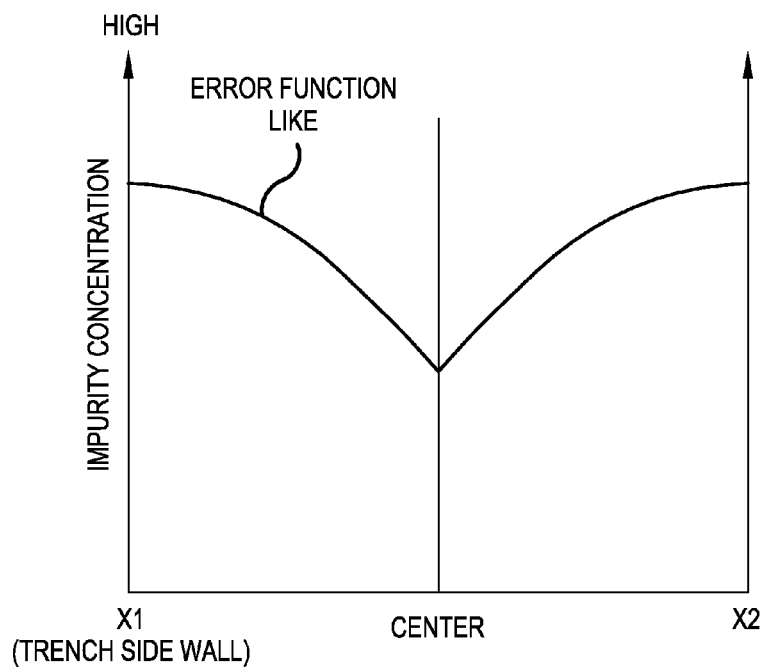
FIG. 14B is a graph showing a profile of impurity concentration in high concentration n type semiconductor region 11 formed by ion implantation in the upper part of n type semiconductor layer 2 along the line X-X in FIG. 6.

FIGS. 14A and 14B illustrate an impurity concentration profile of high concentration n type semiconductor region 11 formed in the upper part of n type semiconductor layer 2 by the ion implantation method, wherein FIG. 14A shows the profile along the line Y-Y in FIG. 6, and includes impurity concentrations for Y1 and Y2, and FIG. 14B shows the profile along the line X-X in FIG. 6, and includes impurity concentrations for X1 and X2. In the FIGS. 14A and 14B, the ordinates represent impurity concentration in a logarithmic scale.

As shown in FIG. 14A, the impurity concentration is constant in the Y direction parallel to side wall 6 of trench 5. In the vicinity of the boundary between the high concentration n type semiconductor region 11 and n type semiconductor layer 2, the impurity concentration shifts from the impurity concentration in high concentration n type semiconductor region 11 to the one in n type semiconductor layer 2. In the lateral direction, the X direction, which is the direction parallel to the principal surface of n type semiconductor substrate 1 and the direction perpendicular to side wall 6 of trench 5, the impurity concentration decreases going from side wall 6 of trench 5. This impurity concentration profile is error function like.

The impurity concentration is highest at side wall 6 of trench 5 and decreases toward the center of high concentration n type semiconductor region 11. An extension of depletion layer 30 is inversely proportional to the square root of the impurity concentration. As a consequence, the speed of extension of depletion layer 30 around side wall 6 of trench 5 is slower than a high concentration n type semiconductor region formed by epitaxial growth and it takes a long time for the whole region of parallel pn layer 20 to be completely depleted. Thus, the turning OFF dV/dt is gentler in the case of high concentration n type semiconductor region 11 formed by an ion implantation method than in the case of the one formed by an epitaxial growth method. Therefore, the trade-off relationship between the Eoff and the turning OFF dV/dt is improved as compared with the case of a high concentration n type semiconductor region formed of an epitaxial layer.

FIG. 15 shows a relationship between a withstand voltage and the ratio of the average thickness D of high concentration n type semiconductor region 11 to the trench depth L obtained by precise simulation.

In the case of high concentration n type semiconductor region 11 formed by the trench embedding process and the ion implantation process, the ratio of the average thickness D of high concentration n type semiconductor region 11 to the trench depth L larger than ½ exhibits unfavorably large charge imbalance and lowers the withstand voltage, as shown in FIG. 15. Thus, the average thickness D of high concentration n type semiconductor region 11 is necessarily at most ½. An average thickness D smaller than ¼ of the trench depth is preferable to improve charge imbalance and a withstand voltage.

Thus, a power semiconductor device such as a MOSFET and its method of manufacturing have been described according to the present invention. Many modifications and variations may be made to the devices and methods described and illustrated herein without departing from the spirit and scope of the invention. Accordingly, it should be understood that the devices and methods described herein are illustrative only and are not limiting upon the scope of the invention.

DESCRIPTION OF SYMBOLS

1: n type semiconductor substrate
2: n type semiconductor layer, which becomes an n type column after forming a trench
2a: n type semiconductor layer before forming a trench
3: oxide film after forming an opening 4a
3a: oxide film before forming an opening 4a
4: opening formed in an n type semiconductor layer 2a
4a: opening formed in an oxide film 3a
5: trench
5a: bottom surface of the trench
6: side wall
7: phosphorus impurity
8: oblique ion implantation
9: shoulder of the trench
10: ion implantation layer
11: high concentration n type semiconductor region
11a: bottom surface of the high concentration n type semiconductor region 11
12: p type semiconductor layer, i.e. a p type column
20: parallel pn layer
30: depletion layer
W: width of the opening of the trench
L: trench depth
Q: length of the ion implantation layer 10
T: pitch of the trench
K: pillar
M: plane of the average depth of the high concentration n type semiconductor region 11
100, 200: semiconductor device

What is claimed is:

1. A semiconductor device having a superjunction structure, the semiconductor device comprising:
a semiconductor substrate of a first conductivity type;
a first conductivity type semiconductor layer disposed on the semiconductor substrate;
a plurality of trenches disposed in the first conductivity type semiconductor layer;
a second conductivity type semiconductor layer embedded in the trench;
a parallel pn layer composed of the first conductivity type semiconductor layer and the second conductivity type semiconductor layer in contact with the first conductivity type semiconductor layer, the first and second semiconductor layers being alternately arranged in a horizontal direction, which is parallel to a principal surface of the semiconductor substrate; and
a high concentration first conductivity type semiconductor region provided in an upper part of the first conductivity type semiconductor layer, the high concentration first conductivity type semiconductor region having an impurity concentration that is higher than an impurity concentration in a lower part of the first conductivity type semiconductor layer and being in contact with the second conductivity type semiconductor layer; wherein
in the high concentration first conductivity type semiconductor region, along the direction parallel to the principal surface of the semiconductor substrate, the impurity concentration of the high concentration first conductivity type semiconductor region is higher at a side in contact with the second conductivity type semiconductor layer than at a central portion of the high concentration first conductivity type semiconductor region; and
an average thickness of the high concentration first conductivity type semiconductor region is at most ½ of the distance from a top surface of the first conductivity type semiconductor layer to a bottom surface of the second conductivity type semiconductor layer.

2. The semiconductor device according to claim 1, wherein distribution of impurity concentration in the high concentration first conductivity type semiconductor region is error function distribution in the horizontal direction, which is parallel to the principal surface of the semiconductor substrate.

3. The semiconductor device according to claim 2, wherein an average thickness of the high concentration first conductivity type semiconductor region is at most ¼ of the distance from the top surface of the first conductivity type semiconductor layer to the bottom surface of the second conductivity type semiconductor layer.

4. The semiconductor device according claim 2, wherein the bottom surface of the high concentration first conductivity type semiconductor region is exhibits a wavy configuration.

5. The semiconductor device according to claim 1, wherein an average thickness of the high concentration first conductivity type semiconductor region is at most ¼ of the distance from the top surface of the first conductivity type semiconductor layer to the bottom surface of the second conductivity type semiconductor layer.

6. The semiconductor device according to claim 5, wherein the bottom surface of the high concentration first conductivity type semiconductor region is exhibits a wavy configuration.

7. The semiconductor device according to claim 1, wherein the bottom surface of the high concentration first conductivity type semiconductor region is exhibits a wavy configuration.

8. A method of manufacturing a semiconductor device having a junction structure, the semiconductor device comprising:
a semiconductor substrate of a first conductivity type,
a first conductivity type semiconductor layer disposed on the semiconductor substrate, a plurality of trenches disposed in the first conductivity type semiconductor layer,
a second conductivity type semiconductor layer embedded in the trench, a parallel pn layer composed of the first conductivity type semiconductor layer and the second conductivity type semiconductor layer in contact with the first conductivity type semiconductor layer, the first and second semiconductor layers being alternately arranged in a horizontal direction, which is parallel to a principal surface of the semiconductor substrate; and a high concentration first conductivity type semiconductor region provided in an upper part of the first conductivity type semiconductor layer, the high concentration first conductivity type semiconductor region having an impurity concentration higher than the one in a lower part of the first conductivity type semiconductor layer;

the method comprising steps of:

forming at least one trench in the first conductivity type semiconductor layer;

ion-implanting first conductivity type impurities on an upper part of a side wall of the trench by an oblique ion implantation process;

filling the trench with the second conductivity type semiconductor layer; and forming the high concentration first conductivity type semiconductor region by a heat-treatment process.

9. The method of manufacturing a semiconductor device according to claim 8, wherein the heat treatment process is conducted after the ion implantation process and before filling the trench with the second conductivity semiconductor layer.

10. The method of manufacturing a semiconductor device according to claim 9, wherein an incident angle θ (°) of the ion implantation with respect to the principal surface of the semiconductor substrate, a width W (μm) of an opening of the trench, and a depth L (μm) of the trench satisfy an inequality:

$$\theta \leq \tan^{-1}(L/(2W)).$$

11. The method of manufacturing a semiconductor device according to claim 9, wherein the thickness of the high concentration first conductivity type semiconductor region from a top surface of the first conductivity type semiconductor layer is at most ½ of a depth of the trench.

12. The method of manufacturing a semiconductor device according to claim 11, wherein the thickness of the high concentration first conductivity type semiconductor region from the top surface of the first conductivity type semiconductor layer is at most ¼ of the depth of the trench.

13. The method of manufacturing a semiconductor device according to claim 8, wherein the heat treatment process is conducted after the ion implantation process and after filling the trench with the second conductivity semiconductor layer.

14. The method of manufacturing a semiconductor device according to claim 13, wherein an incident angle θ (°) of the ion implantation with respect to the principal surface of the semiconductor substrate, a width W (μm) of an opening of the trench, and a depth L (μm) of the trench satisfy an inequality:

$$\theta \leq \tan^{-1}(L/(2W)).$$

15. The method of manufacturing a semiconductor device according to claim 13, wherein the thickness of the high concentration first conductivity type semiconductor region from a top surface of the first conductivity type semiconductor layer is at most ½ of a depth of the trench.

16. The method of manufacturing a semiconductor device according to claim 15, wherein the thickness of the high concentration first conductivity type semiconductor region from the top surface of the first conductivity type semiconductor layer is at most ¼ of the depth of the trench.

17. The method of manufacturing a semiconductor device according to claim 8, wherein an incident angle θ (°) of the ion implantation with respect to the principal surface of the semiconductor substrate, a width W (μm) of an opening of the trench, and a depth L (μm) of the trench satisfy an inequality:

$$\theta \leq \tan^{-1}(L/(2W)).$$

18. The method of manufacturing a semiconductor device according to claim 8, wherein the thickness of the high concentration first conductivity type semiconductor region from a top surface of the first conductivity type semiconductor layer is at most ½ of a depth of the trench.

19. The method of manufacturing a semiconductor device according to claim 18, wherein the thickness of the high concentration first conductivity type semiconductor region from the top surface of the first conductivity type semiconductor layer is at most ¼ of the depth of the trench.

* * * * *